United States Patent
Harada et al.

(10) Patent No.: US 7,738,781 B2
(45) Date of Patent: Jun. 15, 2010

(54) POSITION DETECTING CIRCUIT AND IMAGING APPARATUS

(75) Inventors: Yasunari Harada, Ebina (JP); Hisashi Takeuchi, Tokyo (JP); Kenichi Miyasako, Kawasaki (JP)

(73) Assignees: Olympus Corporation, Tokyo (JP); Olympus Imaging Corp., Tokyo (JP)

( * ) Notice: Subject to any disclaimer, the term of this patent is extended or adjusted under 35 U.S.C. 154(b) by 247 days.

(21) Appl. No.: 12/104,001

(22) Filed: Apr. 16, 2008

(65) Prior Publication Data
US 2008/0272767 A1 Nov. 6, 2008

(30) Foreign Application Priority Data
Apr. 19, 2007 (JP) ............................. 2007-110310

(51) Int. Cl.
 G03B 17/00 (2006.01)
 H04N 5/228 (2006.01)
 G01B 7/00 (2006.01)
 H01L 43/06 (2006.01)
(52) U.S. Cl. ..................... 396/55; 396/263; 348/208.99; 348/208.4; 324/207.12; 324/207.2
(58) Field of Classification Search .................. 396/55
See application file for complete search history.

(56) References Cited

U.S. PATENT DOCUMENTS

| 6,327,433 | B1 * | 12/2001 | Ishikawa et al. ............... 396/55 |
| 7,132,824 | B2 | 11/2006 | Masuda et al. ......... 324/207.12 |
| 2008/0292297 | A1 * | 11/2008 | Fushida et al. ................. 396/55 |

FOREIGN PATENT DOCUMENTS

JP 2005-331399 A 12/2005

* cited by examiner

*Primary Examiner*—Melissa J Koval
(74) *Attorney, Agent, or Firm*—Westerman, Hattori, Daniels & Adrian, LLP

(57) ABSTRACT

A position detecting circuit provided in an imaging apparatus having an optical system that images a subject image, an imaging element that performs photoelectric conversion of the subject image, and a release switch capable of setting states of two stages includes: a plurality of magnetic field change detecting elements that detect the intensity of a magnetic field formed by a magnetic field generating body attached to either the optical system or the imaging element and that are provided so as to be separated from each other; a position detecting portion that detects the position of the magnetic field generating body on the basis of outputs from the plurality of magnetic field change detecting elements; and a standby portion that stops a function of at least one of the position detecting portion and the plurality of magnetic field change detecting elements until a first stage of the release switch is set.

8 Claims, 5 Drawing Sheets

POSITION DETECTING CIRCUIT AND IMAGING APPARATUS

BACKGROUND OF THE INVENTION

1. Field of the Invention

The present invention relates to a position detecting circuit that detects the position of a magnetic field generating body, which is mounted in the same member together with an optical system or an imaging element, and an imaging apparatus.

Priority is claimed on Japanese Patent Application No. 2007-110310, filed Apr. 19, 2007, the content of which is incorporated herein by reference.

2. Description of Related Art

There is known a shake correction mechanism that suppresses image blur on an imaged surface of an imaging element, which is caused by hand shake or the like, by shifting an optical system or the imaging element in the direction perpendicular to an optical axis of the optical system according to the amount of hand shake occurring during photographing using an imaging apparatus. In addition, a position detector is used for the shake correction mechanism in order to detect the position to which the optical system or the imaging element is shifted.

In Japanese Unexamined Patent Application, First Publication No. 2005-331399, a position detector having a magnetic field generating body, a magnetic field change detecting element, and a position detecting portion is disclosed. In the position detector, a current supplied to each of a plurality of magnetic field change detecting elements is controlled such that the sum of the output voltages from the plurality of magnetic field change detecting elements is constant. As a result, a temperature characteristic and an individual difference of the magnetic field generating body are corrected and a difference in output voltages from each of the magnetic field change detecting elements is taken out as a signal indicating the relative position of the magnetic field generating body and the magnetic field change detecting elements.

SUMMARY OF THE INVENTION

According to an aspect of the invention, a position detecting circuit provided in an imaging apparatus having an optical system that images a subject image, an imaging element that performs photoelectric conversion of the subject image that is imaged, and a release switch capable of setting states of two stages for inputting an instruction related to imaging includes: a plurality of magnetic field change detecting elements that detect the intensity of a magnetic field formed by a magnetic field generating body attached to either the optical system or the imaging element and that are provided so as to be separated from each other; a position detecting portion that detects the position of the magnetic field generating body on the basis of outputs from the plurality of magnetic field change detecting elements; and a standby portion that stops a function of at least one of the position detecting portion and the plurality of magnetic field change detecting elements until a first stage of the release switch is set.

In the position detecting circuit according to the aspect of the invention, the standby portion may start functions of the plurality of magnetic field change detecting elements and the position detecting portion when a second stage of the release switch is set.

Furthermore, according to another aspect of the invention, an imaging apparatus includes: an optical system that images a subject image; an imaging element that performs photoelectric conversion of the subject image that is imaged; a release switch capable of setting states of two stages for inputting an instruction related to imaging; a plurality of magnetic field change detecting elements that detect the intensity of a magnetic field formed by a magnetic field generating body attached to either the optical system or the imaging element and that are provided so as to be separated from each other; a position detecting portion that detects the position of the magnetic field generating body on the basis of outputs from the plurality of magnetic field change detecting elements; a standby portion that stops a function of at least one of the position detecting portion and the plurality of magnetic field change detecting elements until a first stage of the release switch is set; a shake detecting portion that detects shake of a housing; and a driving portion that moves either the optical system or the imaging element in the direction perpendicular to an optical axis of the optical system corresponding to the detected amount of shake.

In the imaging apparatus according to the aspect of the invention, the standby portion may start functions of the plurality of magnetic field change detecting elements and the position detecting portion when a second stage of the release switch is set.

Furthermore, in the imaging apparatus according to the aspect of the invention, the position detecting portion may include: a position signal generating circuit that generates a position signal indicating the position of the magnetic field generating body on the basis of outputs from the plurality of magnetic field change detecting elements; and a driving control circuit that controls driving of the plurality of magnetic field change detecting elements so as not to depend on a temperature characteristic or an individual difference of the magnetic field generating body, and the standby portion may start the position signal generating circuit and the driving control circuit at different timings.

Furthermore, in the imaging apparatus according to the aspect of the invention, the standby portion may gradually change the intensity of a start control signal applied to the position detecting portion.

Furthermore, in the imaging apparatus according to the aspect of the invention, the driving control circuit may start functions of the plurality of magnetic field change detecting elements only when a second stage of the release switch is set.

Furthermore, in the imaging apparatus according to the aspect of the invention, the shake detecting portion and the position detecting portion may be formed on different substrates.

DETAILED DESCRIPTION OF THE INVENTION

Hereinafter, embodiments of the invention will be described with reference to the accompanying drawings.

First Embodiment

Figure 1:
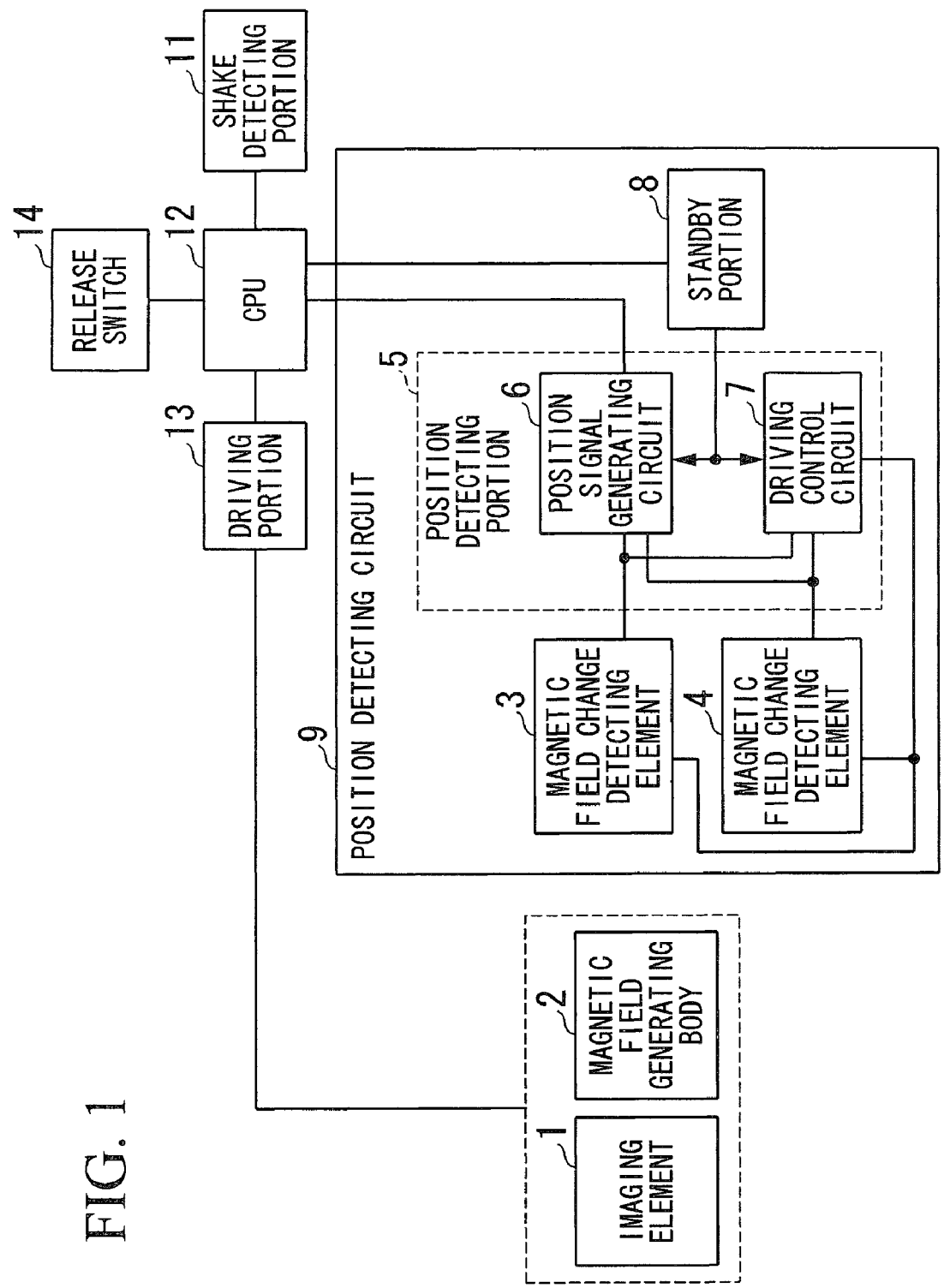
FIG. 1 is a block diagram illustrating the configuration of an imaging apparatus according to a first embodiment of the invention.

First, a first embodiment of the invention will be described. FIG. 1 shows the configuration of an imaging apparatus according to the present embodiment. The imaging apparatus shown in FIG. 1 includes an imaging element 1, a magnetic field generating body 2, a position detecting circuit 9, a shake detecting portion 11, a CPU 12, a driving portion 13, and a release switch 14. In FIG. 1, an optical system that forms a subject image, a signal processing circuit that processes an imaging signal output from the imaging element 1, and a recording medium that records image data generated by imaging are not shown.

The imaging element 1 performs photoelectric conversion of a subject image that is imaged by the optical system (not shown) and outputs an imaging signal to the signal processing circuit (not shown). The magnetic field generating body 2 is a permanent magnet or an electromagnet, for example, and the magnetic field generating body 2 and the imaging element 1 are mounted in the same member. The position detecting circuit 9 detects the intensity of a magnetic field of the magnetic field generating body 2 and outputs a signal, which indicates the position of the magnetic field generating body 2, to the CPU 12. The shake detecting portion 11 is configured to include an angular velocity sensor and an amplifying circuit, for example, and detects the inclination (pitching) of the imaging apparatus in the vertical direction and the inclination (yawing) of the imaging apparatus in the horizontal direction and outputs the detected inclination (pitching) and inclination (yawing) to the CPU 12. The CPU 12 performs various kinds of operations on output signals from the shake detecting portion 11 and the position detecting circuit 9 and controls the position detecting circuit 9 and the driving portion 13. The driving portion 13 moves the imaging element 1 and the magnetic field generating body 2 in unison in the direction perpendicular to an optical axis of the optical system.

The release switch 14 is a switch capable of setting states of two stages for inputting an instruction related to imaging. When the release switch 14 is half-pressed such that a state of a first stage is set, a focus adjustment mechanism (not shown) starts to execute focus adjustment. When the release switch 14 is further pressed in the state of the first stage such that a state of a second stage is set, image data generated by imaging is stored in the recording medium (not shown).

In the position detecting circuit 9, magnetic field change detecting elements 3 and 4 are hole elements, for example, and are provided so as to be separated from each other. The magnetic field change detecting elements 3 and 4 detect the intensity (magnetic flux density) of a magnetic field formed by the magnetic field generating body 2 and output signals corresponding to the detected intensity of the magnetic field to a position signal generating circuit 6 and a driving control circuit 7 of a position detecting portion 5. The position signal generating circuit 6 calculates a difference between the output signals of the magnetic field change detecting elements 3 and 4 and outputs the calculated difference to the CPU 12 as a position signal indicating the relative position of the magnetic field generating body 2 with respect to the magnetic field change detecting elements 3 and 4. Here, in FIG. 1, only two magnetic field change detecting elements (one pair) are shown in order to make later explanation simple. In this case, it is possible to detect the movement of the imaging element 1 in one direction thereof. In an actual shake correction mechanism, at least four magnetic field change detecting elements (two pairs) need to be provided when the position detecting circuit 9 is used for the shake correction mechanism because it is necessary to move the imaging element 1 on a plane perpendicular to the optical axis of the optical system (not shown) for shake correction.

The driving control circuit 7 controls driving of the magnetic field change detecting elements 3 and 4 in order to suppress a temperature characteristic and an individual difference of the magnetic field generating body 2. Specifically, the driving control circuit 7 controls a control signal supplied to the magnetic field change detecting elements 3 and 4 such that the sum of output signals of the magnetic field change detecting elements 3 and 4 is constant. A standby portion 8 starts and stops the position signal generating circuit 6 and the driving control circuit 7.

The shake correction is performed as follows. When the state of the second stage of the release switch 14 is set, the shake detecting portion 11 outputs an angular velocity signal corresponding to the detected shake amount to the CPU 12. The CPU 12 calculates the movement amount, by which the imaging element 1 is to move on the plane perpendicular to the optical axis of the optical system, from the angular velocity signal output from the shake detecting portion 11 and focal length information of the optical system and drives the driving portion 13. The driving portion 13 generates a driving force corresponding to the movement amount calculated by the CPU 12 and moves the imaging element 1 and the magnetic field generating body 2 together in the direction perpendicular to the optical axis of the optical system. The position detecting circuit 9 detects the intensity of the magnetic field of the magnetic field generating body 2 which has moved and outputs to the CPU 12 a position signal indicating the relative position of the magnetic field generating body 2 with respect to the magnetic field change detecting elements 3 and 4. The CPU 12 compares a present position of the imaging element 1 based on the position signal output from the position detecting circuit 9 with a target position of the imaging element 1 based on the amount of shake detected by the shake detecting portion 11 and performs a feedback control on the driving portion 13 until the imaging element 1 moves to the target position. Thus, since it is possible to shift the imaging element 1 to the optimal position perpendicular to the optical axis of the optical system, hand shake occurring during photographing using the imaging apparatus can be eliminated.

Figure 2:
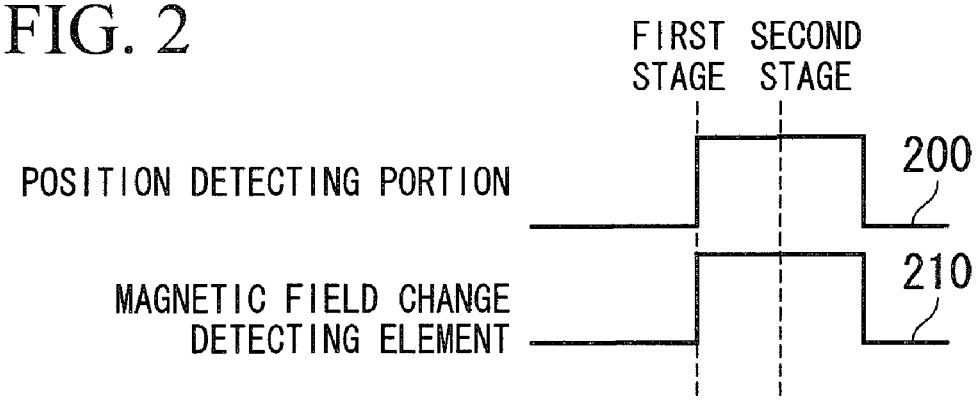
FIG. 2 is a timing chart explaining an operation of the imaging apparatus according to the first embodiment of the invention.

Next, operations at the time of starting and stopping related to a position detecting function will be described. First, an example of a first operation will be described. FIG. 2 shows the waveforms of control signals supplied to the position detecting portion 5 and the magnetic field change detecting elements 3 and 4. In an initial state after the imaging apparatus is started, control signals 200 and 210 supplied to the position detecting portion 5 and the magnetic field change detecting elements 3 and 4 are at L (Low) levels, and accordingly, functions of the position detecting portion 5 and the magnetic field change detecting elements 3 and 4 are stopped. When the release switch 14 is half-pressed to set the state of the first stage, the CPU 12 outputs to the standby portion 8 a signal notifying that the state of the first stage is set.

On the basis of the signal from the CPU 12, the standby portion 8 sets the control signal 200 to an H (High) level to start functions of the position signal generating circuit 6 and the driving control circuit 7 of the position detecting portion 5. In addition, the driving control circuit 7 sets the control signal 210 supplied to the magnetic field change detecting elements 3 and 4 to an H level simultaneously with the start to thereby start the functions of the magnetic field change detecting elements 3 and 4.

When photographing (exposure) ends after the release switch 14 is further pressed and the state of the second stage is set, the CPU 12 outputs to the standby portion 8 a signal notifying that the photographing has ended. On the basis of the signal from the CPU 12, the standby portion 8 sets the control signal 200 to an L level to stop the functions of the position signal generating circuit 6 and the driving control circuit 7 of the position detecting portion 5. At the same time, the driving control circuit 7 sets the control signal 210 to an L level to stop the functions of the magnetic field change detecting elements 3 and 4.

As described above, since the functions of the position detecting portion 5 and the magnetic field change detecting elements 3 and 4 are stopped until the first stage of the release switch 14 is set, the power consumption can be reduced.

Figure 3:
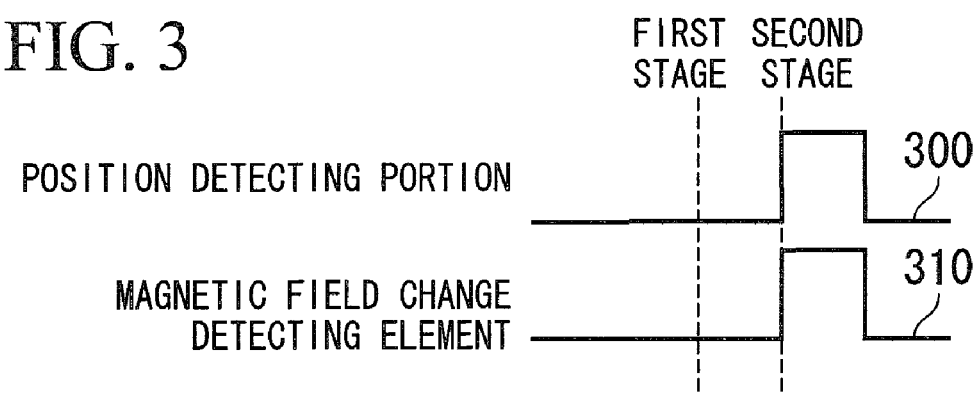
FIG. 3 is a timing chart explaining an operation of the imaging apparatus according to the first embodiment of the invention.

Next, an example of a second operation will be described. FIG. 3 shows the waveforms of control signals supplied to the position detecting portion 5 and the magnetic field change detecting elements 3 and 4. In an initial state after the imaging apparatus is started, control signals 300 and 310 supplied to the position detecting portion 5 and the magnetic field change detecting elements 3 and 4 are at L (Low) levels, and accordingly, functions of the position detecting portion 5 and the magnetic field change detecting elements 3 and 4 are stopped. In addition, even if the release switch 14 is half-pressed such that the state of the first stage is set, the functions of the position detecting portion 5 and the magnetic field change detecting elements 3 and 4 are stopped because the control signals 300 and 310 are at L levels.

When the release switch 14 is further pressed to set the state of the second stage, the CPU 12 outputs to the standby portion 8 a signal notifying that the state of the second stage is set. On the basis of the signal from the CPU 12, the standby portion 8 sets the control signal 300 to an H level to start functions of the position signal generating circuit 6 and the driving control circuit 7 of the position detecting portion 5. In addition, the driving control circuit 7 sets the control signal 310 supplied to the magnetic field change detecting elements 3 and 4 to an H level simultaneously with the start to thereby start the functions of the magnetic field change detecting elements 3 and 4.

When photographing ends, the CPU 12 outputs to the standby portion 8 a signal indicating that the photographing has ended. On the basis of the signal from the CPU 12, the standby portion 8 sets the control signal 300 to an L level to stop the functions of the position signal generating circuit 6 and the driving control circuit 7 of the position detecting portion 5. At the same time, the driving control circuit 7 sets the control signal 310 to an L level to stop the functions of the magnetic field change detecting elements 3 and 4.

As described above, since the functions of the position detecting portion 5 and the magnetic field change detecting elements 3 and 4 are stopped until the second stage of the release switch 14 is set, the power consumption can be reduced. In addition, power consumption until the second stage is set after the first stage of the release switch 14 is set can be reduced as compared with the first operation example.

Second Embodiment

Next, a second embodiment of the invention will be described. Since the configuration of an imaging apparatus according to the present embodiment is the same as that shown in FIG. 1, an explanation thereof will be omitted. Here, if the function of the position detecting portion 5 is started/stopped immediately after the second stage of the release switch 14 is set, that is, immediately before exposure, an output of the shake detecting portion 11 may be changed. Therefore, the imaging apparatus according to the present embodiment operates such that the output change of the shake detecting portion 11 is suppressed and the power consumption is reduced.

Figure 4:
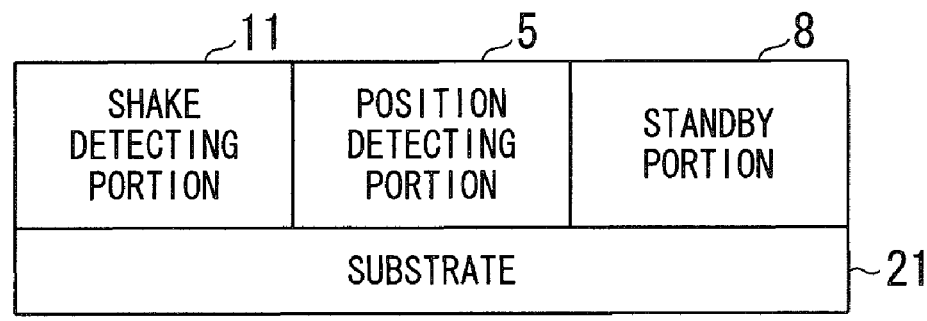
FIG. 4 is a partially sectional view illustrating an imaging apparatus according to a second embodiment of the invention.
Figure 5:
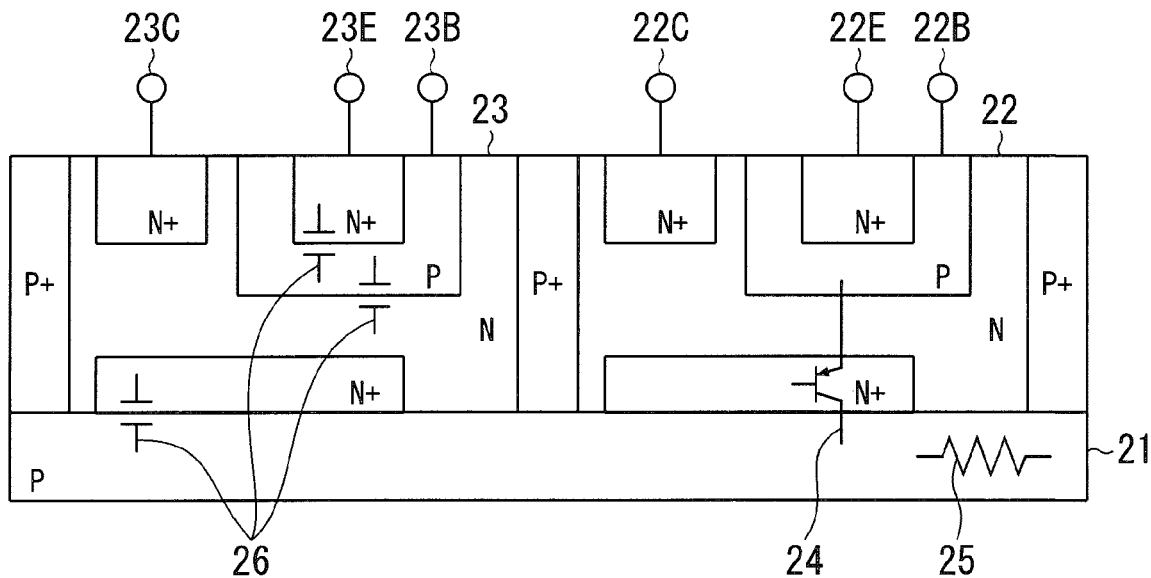
FIG. 5 is a partially sectional view illustrating the imaging apparatus according to the second embodiment of the invention.

First, a principle of a change in the output of the shake detecting portion 11 will be described. FIG. 4 shows a partial section of the imaging apparatus. As shown in FIG. 4, the position detecting portion 5, the standby portion 8, and the shake detecting portion 11 are mounted on the same integrated circuit (IC) and are formed on a same substrate 21. FIG. 5 shows a detailed partial section of transistors that form the position detecting portion 5 and the shake detecting portion 11. In FIG. 5, a transistor 22 having a base terminal 22B, an emitter terminal 22E, and a collector terminal 22C is a part of transistors that form the position detecting portion 5. In addition, a transistor 23 having a base terminal 23B, an emitter terminal 23E, and a collector terminal 23C is a part of transistors that form the shake detecting portion 11.

When the transistor 22 is turned on, the transistor 22 reaches an active state from a cutoff state through a saturation state. In addition, a parasitic transistor 24 generated due to a structure of a bipolar transistor makes a current (saturation current) flow to the substrate 21 in a saturation state of the transistor 22. Since a change in electric potential of the substrate 21 generated by a product of the saturation current and a resistive component 25 of the substrate 21 affects an operation of the transistor 23 through a parasitic capacitance 26 of the transistor 23, the output of the shake detecting portion 11 is changed. The output of the shake detecting portion 11 easily changes as the saturation current is large and changes abruptly.

Figure 6:
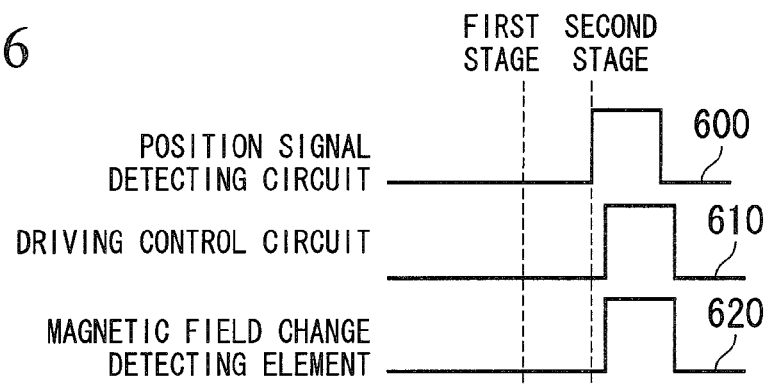
FIG. 6 is a timing chart explaining an operation of the imaging apparatus according to the second embodiment of the invention.

Next, a first operation example of the present embodiment will be described. FIG. 6 shows the waveforms of control signals supplied to the position signal generating circuit 6 and the driving control circuit 7 of the position detecting portion 5, and the magnetic field change detecting elements 3 and 4. In an initial state after the imaging apparatus is started, control signals 600, 610, and 620 supplied to the position signal generating circuit 6, the driving control circuit 7, and the magnetic field change detecting elements 3 and 4 are at L levels, and accordingly, functions of the position signal generating circuit 6, the driving control circuit 7, and the magnetic field change detecting elements 3 and 4 are stopped. In addition, even if the release switch 14 is half-pressed such that the state of the first stage is set, the functions of the position signal generating circuit 6, the driving control circuit 7, and the magnetic field change detecting elements 3 and 4 are stopped because the control signals 600, 610, and 620 are at L levels.

When the release switch 14 is further pressed to set the state of the second stage, the CPU 12 outputs to the standby portion 8 a signal notifying that the state of the second stage is set. On the basis of the signal from the CPU 12, the standby portion 8 sets the control signal 600 to an H level to start the function of the position signal generating circuit 6. In addition, the standby portion 8 sets the control signal 610 to an H level at a timing slightly later than the starting of the position signal generating circuit 6, thereby starting the function of the driving control circuit 7. Then, the driving control circuit 7 sets the control signal 620 to an H level to start the functions of the magnetic field change detecting elements 3 and 4.

When photographing ends, the CPU 12 outputs to the standby portion 8 a signal indicating that the photographing has ended. On the basis of the signal from the CPU 12, the standby portion 8 sets the control signal 600 to an L level to stop the function of the position signal generating circuit 6. Then, the standby portion 8 sets the control signal 610 to an L level to stop the function of the driving control circuit 7. Then, the driving control circuit 7 sets the control signal 620 to an L level to stop the functions of the magnetic field change detecting elements 3 and 4.

As described above, by making different the timings at which the functions of the position signal generating circuit 6, the driving control circuit 7, and the magnetic field change detecting elements 3 and 4 are started when the state of the second stage of the release switch 14 is set, an instantaneous value of the saturation current flowing through the substrate 21 is reduced, and accordingly, it becomes possible to reduce a change in an electric potential of the substrate 21. Thus, it is possible to reduce erroneous detection of the shake detecting portion 11 by reducing a change in an output of the shake detecting portion 11 immediately after the second stage of the release switch 14 is set.

Figure 7:
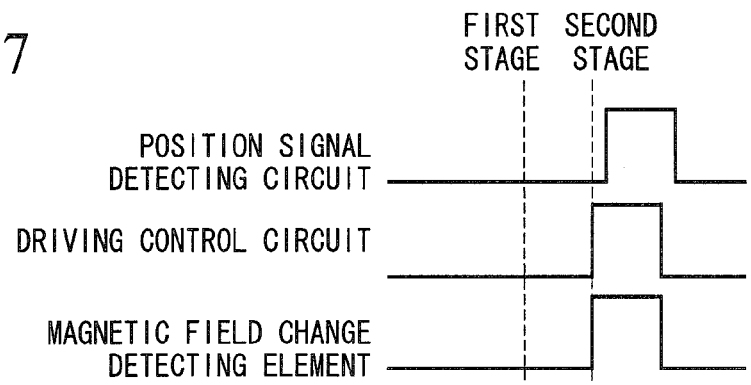
FIG. 7 is a timing chart explaining an operation of the imaging apparatus according to the second embodiment of the invention.

Although the position signal generating circuit 6, the driving control circuit 7, and the magnetic field change detecting elements 3 and 4 are started in this order in FIG. 6, the position signal generating circuit 6, the driving control circuit 7, and the magnetic field change detecting elements 3 and 4 may also be started in the order of the driving control circuit 7, the magnetic field change detecting elements 3 and 4, and the position signal generating circuit 6 as shown in FIG. 7. In addition, the functions of the position signal generating circuit 6, the driving control circuit 7, and the magnetic field change detecting elements 3 and 4 may be made to start at different timings when the first stage of the release switch 14 is set.

Figure 8:
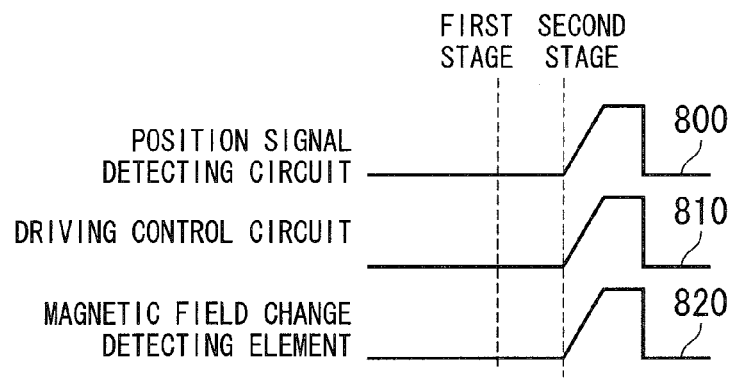
FIG. 8 is a timing chart explaining an operation of the imaging apparatus according to the second embodiment of the invention.

Next, an example of a second operation will be described. FIG. 8 shows the waveforms of control signals supplied to the position signal generating circuit 6, the driving control circuit 7, and the magnetic field change detecting elements 3 and 4. In an initial state after the imaging apparatus is started, control signals 800, 810, and 820 supplied to the position signal generating circuit 6, the driving control circuit 7, and the magnetic field change detecting elements 3 and 4 are at L levels, and accordingly, functions of the position signal generating circuit 6, the driving control circuit 7, and the magnetic field change detecting elements 3 and 4 are stopped. In addition, even if the release switch 14 is half-pressed such that the state of the first stage is set, the functions of the position signal generating circuit 6, the driving control circuit 7, and the magnetic field change detecting elements 3 and 4 are stopped because the control signals 800, 810, and 820 are at L levels.

When the release switch 14 is further pressed to set the state of the second stage, the CPU 12 outputs to the standby portion 8 a signal notifying that the state of the second stage is set. On the basis of the signal from the CPU 12, the standby portion 8 sets the control signals 800 and 810 to H levels to start functions of the position signal generating circuit 6 and the driving control circuit 7. In this case, the standby portion 8 controls the control signals 800 and 810 such that the intensities of the control signals applied to the position signal generating circuit 6 and the driving control circuit 7 gradually increase as shown in FIG. 8. As a result, the functions of the position signal generating circuit 6 and the driving control circuit 7 slowly start. Thereafter, the driving control circuit 7 sets the control signal 820 to an H level such that the intensity of the control signal 820 applied to the magnetic field change detecting elements 3 and 4 gradually increases, thereby starting the functions of the magnetic field change detecting elements 3 and 4.

When photographing ends, the CPU 12 outputs to the standby portion 8 a signal indicating that the photographing has ended. On the basis of the signal from the CPU 12, the standby portion 8 sets the control signals 800 and 810 to L levels to stop the functions of the position signal generating circuit 6 and the driving control circuit 7. Then, the driving control circuit 7 sets the control signal 820 to an L level to stop the functions of the magnetic field change detecting elements 3 and 4.

As described above, by lengthening the starting times of the timing at which the functions of the position signal generating circuit 6, the driving control circuit 7, and the magnetic field change detecting elements 3 and 4 are started when the second stage of the release switch 14 is set, an instantaneous value of the saturation current flowing through the substrate 21 is reduced, and accordingly, it becomes possible to reduce a change in an electric potential of the substrate 21. Thus, it is possible to reduce erroneous detection of the shake detecting portion 11 by reducing a change in an output of the shake detecting portion 11 immediately after the second stage of the release switch 14 is set. In addition, when the first stage of the release switch 14 is set, the functions of the position signal generating circuit 6, the driving control circuit 7, and the magnetic field change detecting elements 3 and 4 may be slowly started in the same manner as described above.

Figure 9:
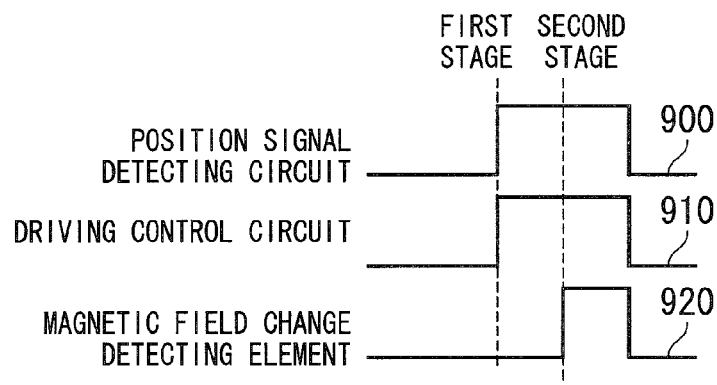
FIG. 9 is a timing chart explaining an operation of the imaging apparatus according to the second embodiment of the invention.

Next, an example of a third operation will be described. FIG. 9 shows the waveforms of control signals supplied to the position signal generating circuit 6, the driving control circuit 7, and the magnetic field change detecting elements 3 and 4. In an initial state after the imaging apparatus is started, control signals 900, 910, and 920 supplied to the position signal generating circuit 6, the driving control circuit 7, and the magnetic field change detecting elements 3 and 4 are at L levels, and accordingly, functions of the position signal generating circuit 6, the driving control circuit 7, and the magnetic field change detecting elements 3 and 4 are stopped. When the release switch 14 is half-pressed to set the state of the first stage, the CPU 12 outputs to the standby portion 8 a signal notifying that the state of the first stage is set.

On the basis of the signal from the CPU 12, the standby portion 8 sets the control signals 900 and 910 to H levels to start functions of the position signal generating circuit 6 and the driving control circuit 7. When the release switch 14 is further pressed to set the state of the second stage, the CPU 12 outputs to the driving control circuit 7 a signal notifying that the state of the second stage is set. On the basis of the signal from the CPU 12, the driving control circuit 7 sets the control signal 920 to an H Level to start the functions of the magnetic field change detecting elements 3 and 4.

When photographing ends, the CPU 12 outputs to the standby portion 8 a signal indicating that the photographing has ended. On the basis of the signal from the CPU 12, the standby portion 8 sets the control signals 900 and 910 to L levels to stop the functions of the position signal generating circuit 6 and the driving control circuit 7. At the same time, the driving control circuit 7 sets the control signal 920 to an L level to stop the functions of the magnetic field change detecting elements 3 and 4.

As described above, by making the timings at which the functions of the position signal generating circuit 6 and the driving control circuit 7 are started different from the timings at which the functions of the magnetic field change detecting elements 3 and 4 are started and starting the functions of the magnetic field change detecting elements 3 and 4 only when the state of the second stage of the release switch 14 is set, an instantaneous value of the saturation current flowing through the substrate 21 is reduced, and accordingly, it becomes possible to reduce a change in an electric potential of the substrate 21. Thus, it is possible to reduce erroneous detection of the shake detecting portion 11 by reducing a change in an output of the shake detecting portion 11 immediately after the second stage of the release switch 14 is set.

Figure 10:
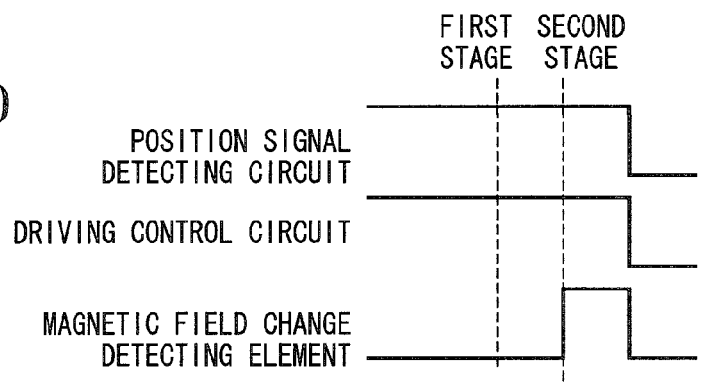
FIG. 10 is a timing chart explaining an operation of the imaging apparatus according to the second embodiment of the invention.

In addition, as shown in FIG. 10, the functions of the position signal generating circuit 6 and the driving control circuit 7 may be started even before the state of the first stage of the release switch 14 is set, such that the functions of the magnetic field change detecting elements 3 and 4 are started when the state of the second stage of the release switch 14 is set. In the case of such an operation, it is difficult for the shake detecting portion 11 to perform erroneous detection. In particular, the case is effective for photographing in which the state of the second stage is set immediately after the state of the first stage of the release switch 14 is set.

Figure 11:
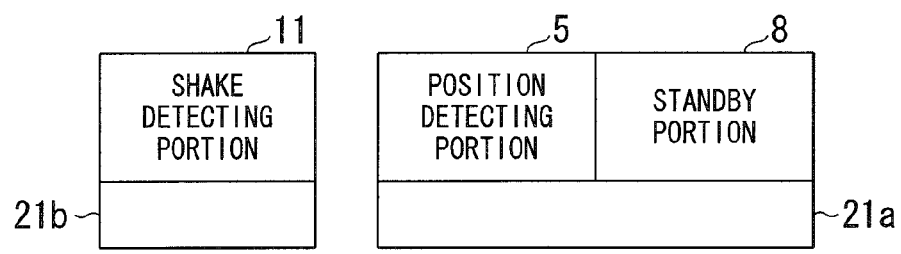
FIG. 11 is a partially sectional view illustrating the imaging apparatus (modified example) according to the second embodiment of the invention.

Next, a modified example of the present embodiment will be described. FIG. 11 shows a partial section of an imaging apparatus. As shown in FIG. 11, the position detecting portion 5 and the standby portion 8 are formed on a substrate 21*a*, and the shake detecting portion 11 is formed on a substrate 21*b* different from the substrate 21*a*. The shake detecting portion 11 is not affected by a change in an electric potential of the substrate 21*a* of the position detecting portion 5 by separating the substrates of the position detecting portion 5 and the shake detecting portion 11 from each other. Accordingly, since a change in an output of the shake detecting portion 11 immediately after the second stage of the release switch 14 is set does not occur, the erroneous detection of the shake detecting portion 11 can be eliminated.

Third Embodiment

Figure 12:
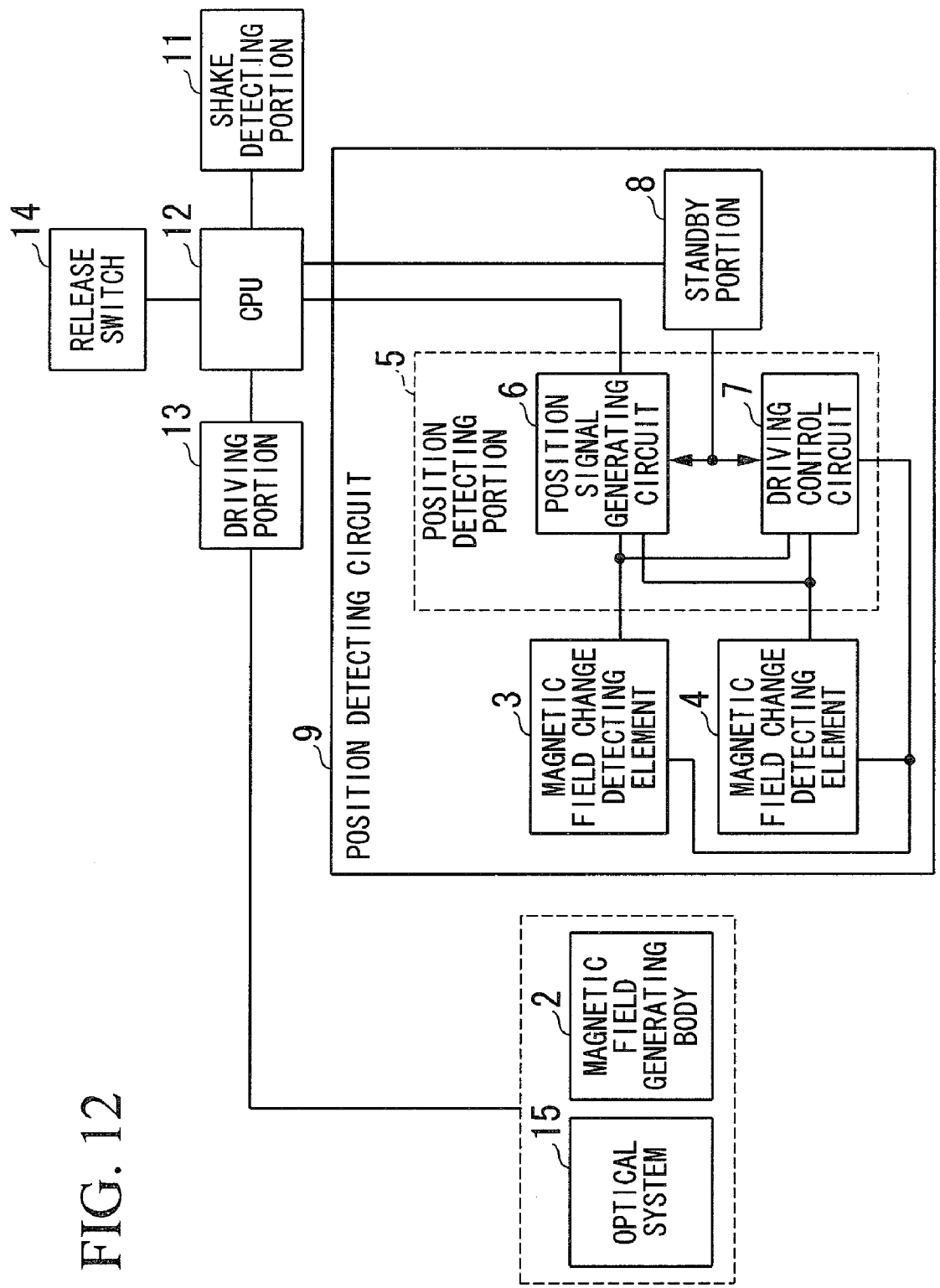
FIG. 12 is a block diagram illustrating the configuration of an imaging apparatus according to a third embodiment of the invention.

Next, a third embodiment of the invention will be described. FIG. 12 shows the configuration of an imaging apparatus according to the present embodiment. In the present embodiment, a magnetic field generating body 2 is attached to an optical system 15, and the optical system 15 and the magnetic field generating body 2 move together in the direction perpendicular to an optical axis of the optical system. In FIG. 12, the imaging element 1 shown in FIG. 1 is not shown. In addition, an operation of the imaging apparatus is the same as that in the first embodiment or the second embodiment. Effects of the present embodiment are also the same as those of the first embodiment or the second embodiment.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

According to the invention, a function of at least one of the position detecting portion and the plurality of magnetic field change detecting elements is stopped until the first stage of the release switch is set, and accordingly, power consumption can be reduced.

What is claimed is:

1. A position detecting circuit provided in an imaging apparatus having an optical system that images a subject image, an imaging element that performs photoelectric conversion of the subject image that is imaged, and a release switch capable of setting states of two stages for inputting an instruction related to imaging, comprising:
   a plurality of magnetic field change detecting elements that detect the intensity of a magnetic field formed by a magnetic field generating body attached to either the optical system or the imaging element and that are provided so as to be separated from each other;
   a position detecting portion that detects the position of the magnetic field generating body on the basis of outputs from the plurality of magnetic field change detecting elements; and
   a standby portion that stops a function of at least one of the position detecting portion and the plurality of magnetic field change detecting elements until a first stage of the release switch is set.

2. The position detecting circuit according to claim 1, wherein the standby portion starts functions of the plurality of magnetic field change detecting elements and the position detecting portion when a second stage of the release switch is set.

3. An imaging apparatus comprising:
   an optical system that images a subject image;
   an imaging element that performs photoelectric conversion of the subject image that is imaged;
   a release switch capable of setting states of two stages for inputting an instruction related to imaging;
   a plurality of magnetic field change detecting elements that detect the intensity of a magnetic field formed by a magnetic field generating body attached to either the optical system or the imaging element and that are provided so as to be separated from each other;
   a position detecting portion that detects the position of the magnetic field generating body on the basis of outputs from the plurality of magnetic field change detecting elements;
   a standby portion that stops a function of at least one of the position detecting portion and the plurality of magnetic field change detecting elements until a first stage of the release switch is set;
   a shake detecting portion that detects shake of a housing; and
   a driving portion that moves either the optical system or the imaging element in the direction perpendicular to an optical axis of the optical system corresponding to the detected amount of shake.

4. The imaging apparatus according to claim 3,
wherein the standby portion starts functions of the plurality of magnetic field change detecting elements and the position detecting portion when a second stage of the release switch is set.

5. The imaging apparatus according to claim 3,
wherein the position detecting portion includes:
a position signal generating circuit that generates a position signal indicating the position of the magnetic field generating body on the basis of outputs from the plurality of magnetic field change detecting elements; and
a driving control circuit that controls driving of the plurality of magnetic field change detecting elements so as not to depend on a temperature characteristic or an individual difference of the magnetic field generating body, and wherein the standby portion starts the position signal generating circuit and the driving control circuit at different timings.

6. The imaging apparatus according to claim 3,
wherein the standby portion gradually changes the intensity of a start control signal applied to the position detecting portion.

7. The imaging apparatus according to claim 5,
wherein the driving control circuit starts functions of the plurality of magnetic field change detecting elements only when a second stage of the release switch is set.

8. The imaging apparatus according to claim 3,
wherein the shake detecting portion and the position detecting portion are formed on different substrates.

* * * * *